United States Patent
Chen

(10) Patent No.: US 10,172,242 B1
(45) Date of Patent: Jan. 1, 2019

(54) ALL-METAL SIDE-INSERTED FEMALE CONNECTOR HAVING GUIDE HOLE AND ELASTIC PIECES FOR GUIDING WIRE

(71) Applicant: Xiamen GHGM Industrial Trade Co., Ltd., Xiamen (CN)

(72) Inventor: Bingshui Chen, Xiamen (CN)

(73) Assignee: XIAMEN GHGM INDUSTRIAL TRADE CO., LTD., Xiamen, Fujian (CN)

( * ) Notice: Subject to any disclaimer, the term of this patent is extended or adjusted under 35 U.S.C. 154(b) by 0 days.

(21) Appl. No.: 15/869,075

(22) Filed: Jan. 12, 2018

(51) Int. Cl.
| | |
|---|---|
| H01R 12/00 | (2006.01) |
| H05K 3/34 | (2006.01) |
| H01R 13/627 | (2006.01) |
| H01R 43/16 | (2006.01) |
| H01R 13/11 | (2006.01) |
| H01R 12/70 | (2011.01) |
| H01R 43/02 | (2006.01) |

(52) U.S. Cl.
CPC ............ *H05K 3/341* (2013.01); *H01R 12/707* (2013.01); *H01R 13/111* (2013.01); *H01R 13/627* (2013.01); *H01R 43/0256* (2013.01); *H01R 43/16* (2013.01)

(58) Field of Classification Search
CPC ...... H01R 12/00; H01R 12/52; H01R 12/526; H01R 12/707; H01R 13/111; H01R 13/627; H01R 43/10; H01R 43/0256

USPC .............. 439/81, 82, 83, 437, 438, 439, 884
See application file for complete search history.

(56) References Cited

U.S. PATENT DOCUMENTS

| | | | | |
|---|---|---|---|---|
| 3,711,819 | A * | 1/1973 | Matthews | H01R 13/11 439/682 |
| 9,136,641 | B2 * | 9/2015 | Bishop | H01R 13/62 |
| 9,673,544 | B1 * | 6/2017 | Chen | H01R 12/718 |
| 9,722,343 | B2 * | 8/2017 | Lappoehn | H01R 13/432 |
| 2014/0242833 | A1 * | 8/2014 | Mostoller | H01R 4/4836 439/438 |
| 2017/0012379 | A1 * | 1/2017 | Chen | H01R 13/11 |

* cited by examiner

*Primary Examiner* — Chandrika Prasad
(74) *Attorney, Agent, or Firm* — Muncy, Geissler, Olds & Lowe, P.C.

(57) ABSTRACT

An all-metal side-inserted female connector has a top side, a front side, and a rear side. The rear side is formed with a guide hole for insertion of a conductive wire or an insertion pin. A pair of elastic pieces is provided between the front side and the rear side, facing the guide hole, for clamping the conductive wire or insertion pin. The front side is formed with a limit hole aligned with the guide hole for limiting the amplitude of the swing the inserted conductive wire or insertion pin. The front side and the lower end are formed with a front weld leg and a rear leg at respective lower ends thereof. The front weld leg and the rear weld leg are electrically connected to a circuit board.

8 Claims, 13 Drawing Sheets

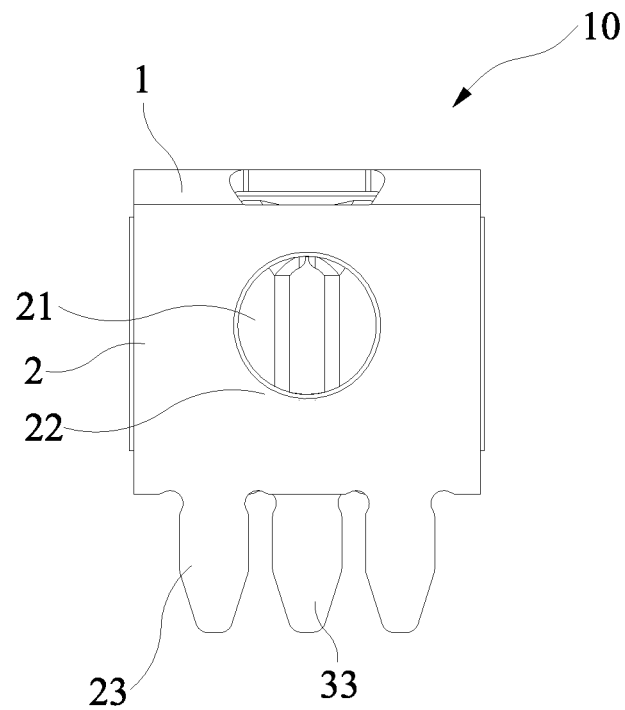
F I G. 17
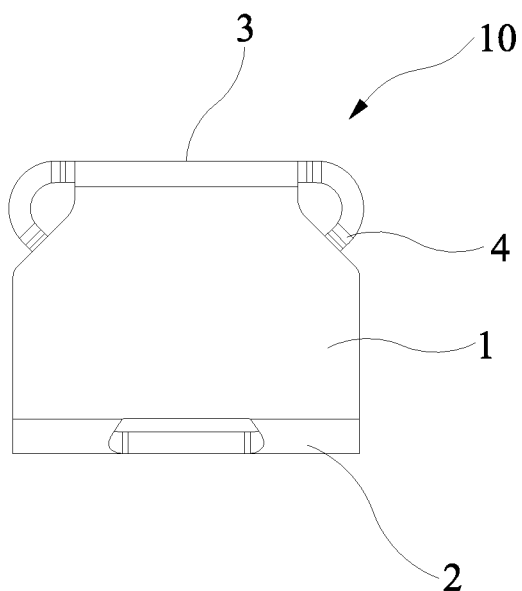
F I G. 18

ALL-METAL SIDE-INSERTED FEMALE CONNECTOR HAVING GUIDE HOLE AND ELASTIC PIECES FOR GUIDING WIRE

BACKGROUND OF THE INVENTION

1. Field of the Invention

The present invention relates to an electrical connector, and moreparticularly to an all-metal side-inserted female connector.

2. Description of the Prior Art

In the prior art, a conductive wire is connected to a printed circuit board by soldering. It is inconvenient for connection. The operation efficiency is low. The connection is not firm and unstable. There are a variety of electrical connectors on the market for connection of circuit boards and conductive wires. But, the structures of various electrical connectors are not the same, so the connecting effect is not the same. In order to achieve a better electrical connection, the industry still research and develop hard in order to obtain more a reliable electrical connection. Accordingly, the inventor of the present invention has devoted himself based on his many years of practical experiences to solve these problems.

SUMMARY OF THE INVENTION

The primary object of the present invention is to provide an all-metal side-inserted female connector. The structure is simple. The connection is convenient and reliable.

In order to achieve the aforesaid object, the all-metal side-inserted female connector of the present invention has a top side, a front side, and a rear side. The rear side is formed with a guide hole. A pair of elastic pieces is provided between the front side and the rear side, facing the guide hole. The front side is formed with a limit hole aligned with the guide hole. The front side and the lower end are formed with a front weld leg and a rear leg at respective lower ends thereof. The front weld leg and the rear weld leg are electrically connected to a circuit board.

Preferably, the pair of elastic pieces is formed by bending left and right ends of the rear side to face each other.

Preferably, the front weld leg and the rear weld leg are formed by bending the respective lower ends of the front side and the rear side and are fixed to the circuit board by reflow soldering.

Preferably, the front weld leg and the rear weld leg are formed by extending the respective lower ends of the front side and the rear side to be inserted into insertion holes of the circuit board and are fixed by wave soldering.

Preferably, an edge of the guide hole is formed with a chamfer.

Preferably, an edge of the limit hole is formed with a chamfer.

Preferably, the all-metal side-mounted female connector is formed by stamping and bending a metal sheet.

After adopting the above scheme, the structure of the present invention is simple. When assembled, the front weld leg and the rear weld leg are soldered to the circuit board so as to achieve the electrical connection. When in use, after the conductive wire or the insertion pin is inserted through the guide hole, the elastic pieces are contact with the conductive wire or the insertion pin, and the conductive wire or the insertion pin continues to go forward to pass through the limit hole to achieve the electrical connection between the conductive wire/the insertion pin and the circuit board. The present invention facilitates the operation of the electrical connection. The limit hole and the guide hole jointly limit the amplitude of the swing of the inserted conductive wire or the insertion pin to protect the elastic pieces, thereby preventing the elastic pieces from being crushed and improving the reliability of the product.

BRIEF DESCRIPTION OF THE DRAWINGS

FIGS. 17-21 are a front view, a top view, a rear view, a bottom view and a side view of FIG. 14;

DETAILED DESCRIPTION OF THE PREFERRED EMBODIMENTS

Embodiments of the present invention will now be described, by way of example only, with reference to the accompanying drawings.

Figure 1:
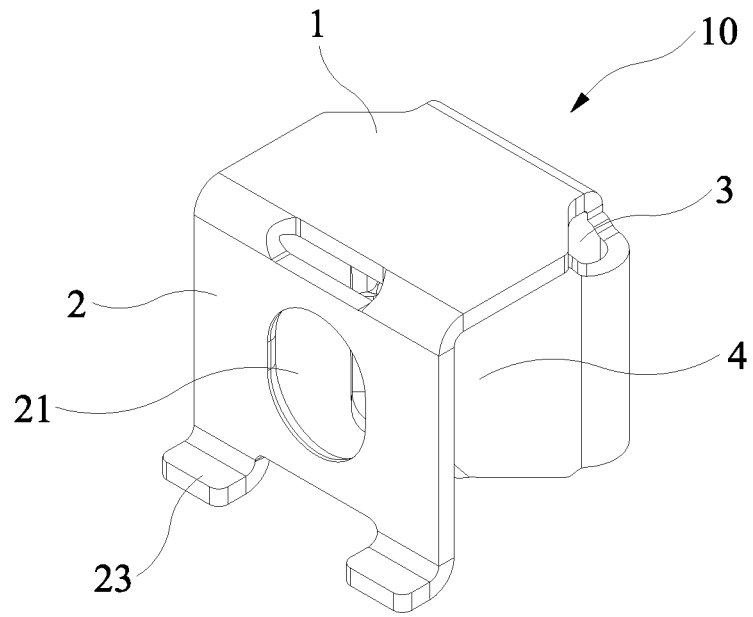
FIGS. 1-3 are perspective views in accordance with a first embodiment of the present invention seen from three different angles.
Figure 2:
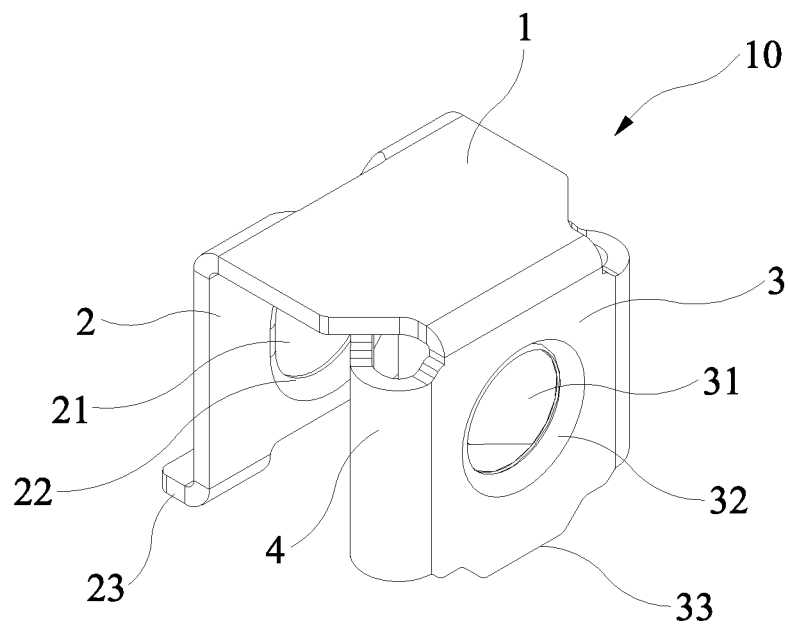
Figure 3:
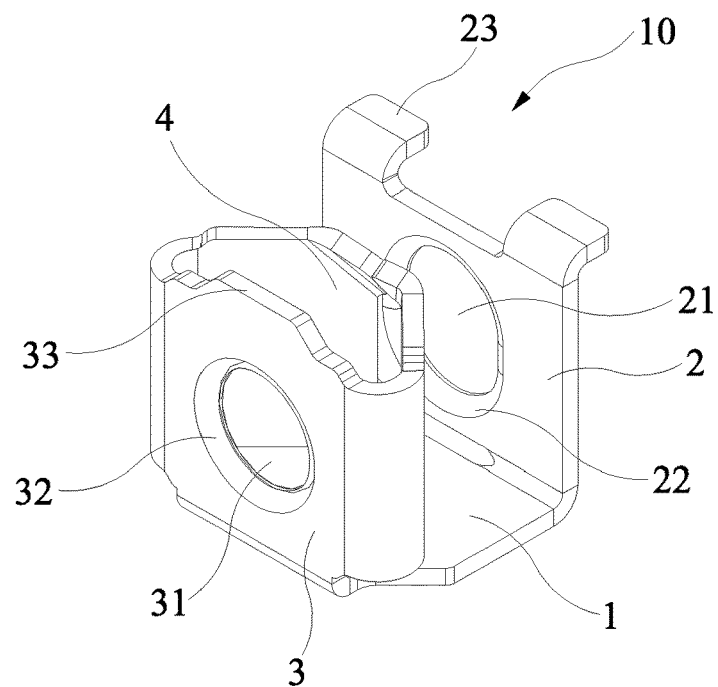
Figure 4:
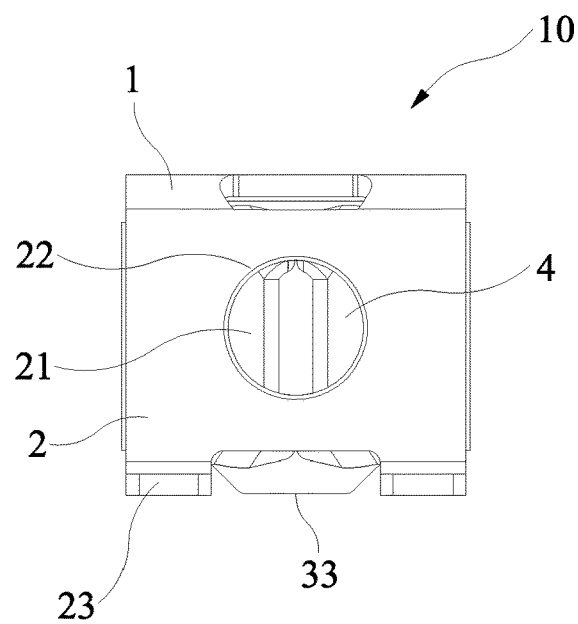
FIGS. 4-8 are a front view, a top view, a rear view, a bottom view and a side view of FIG. 1.
Figure 5:
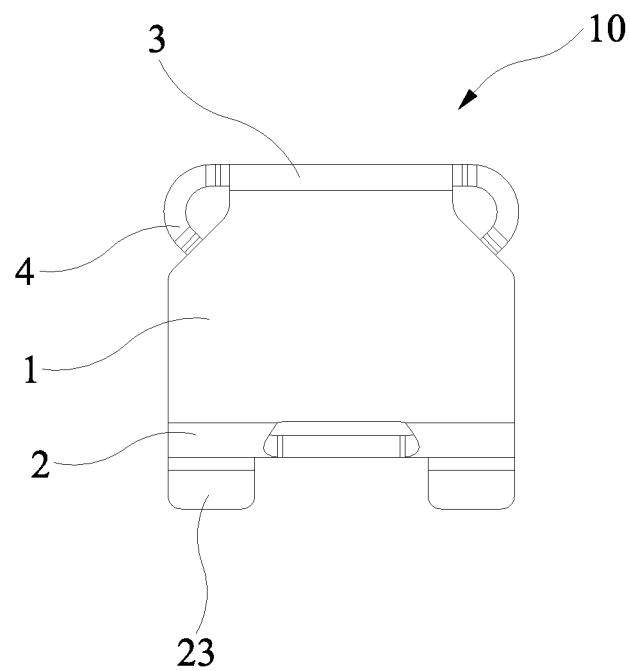
Figure 6:
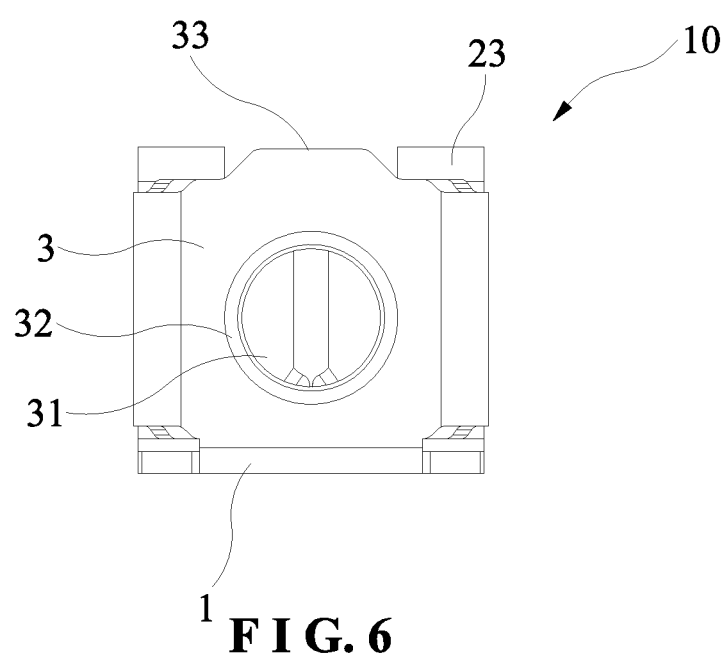
Figure 7:
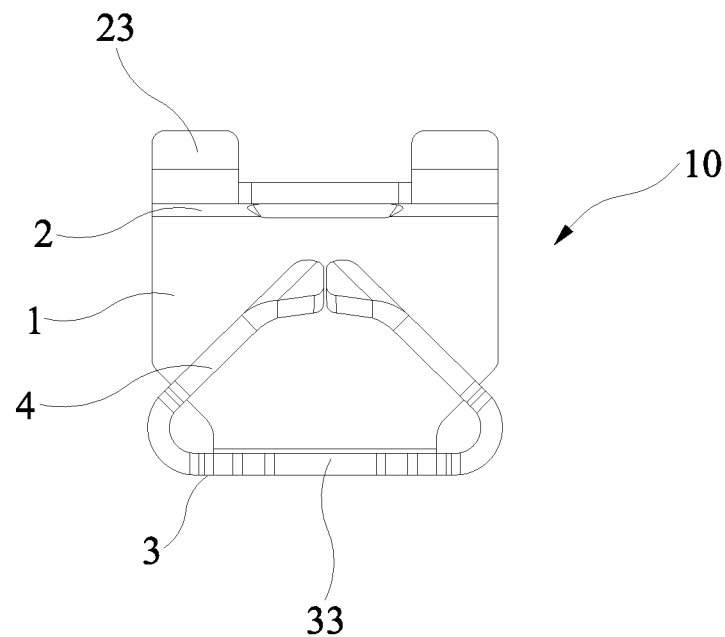
Figure 8:
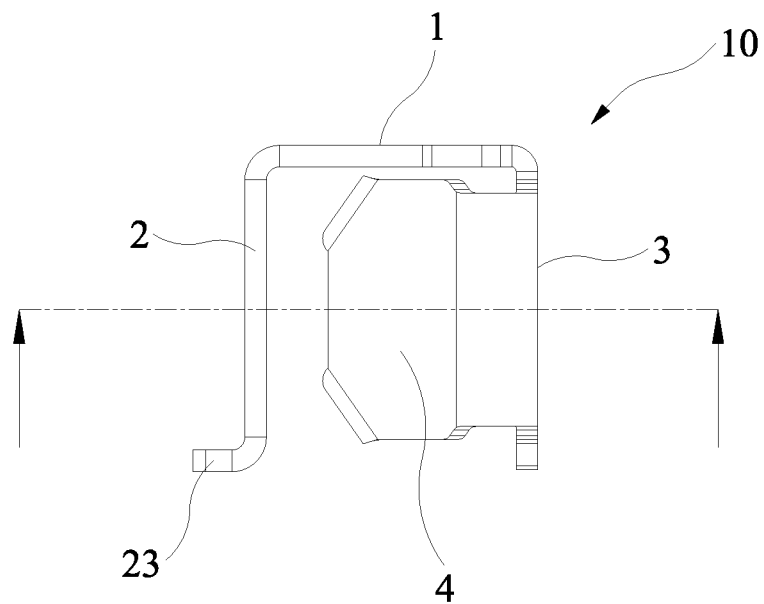
Figure 9:
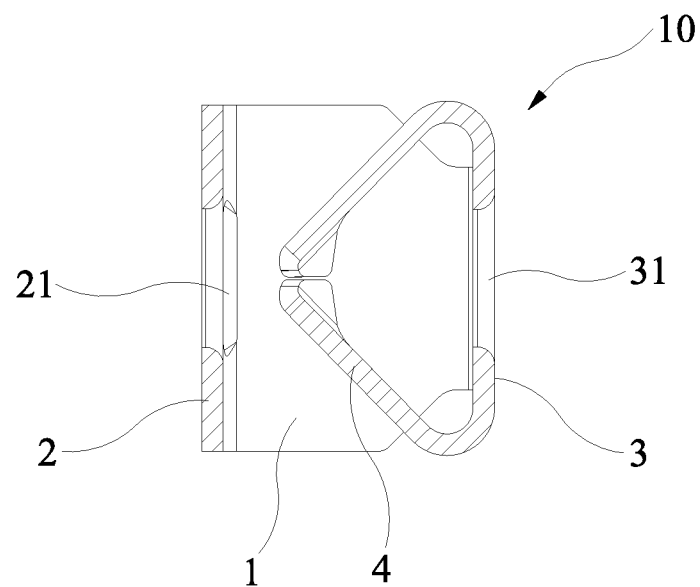
FIG. 9 is a sectional view of FIG. 8.
Figure 10:
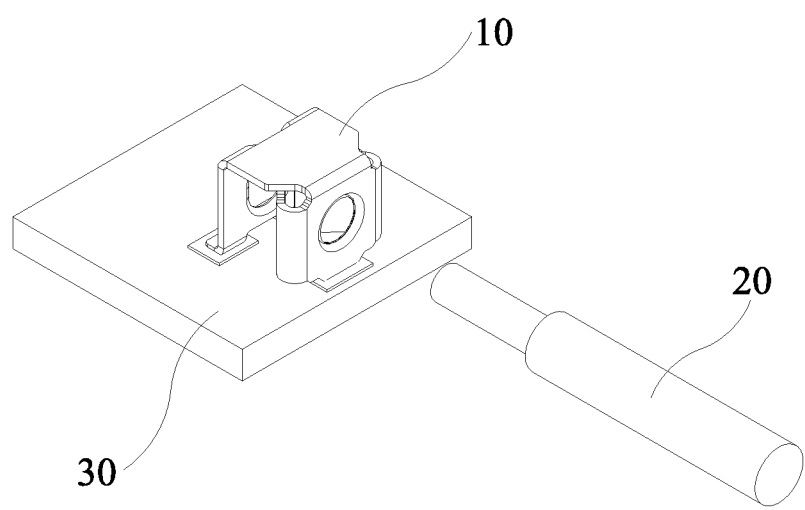
FIGS. 10-11 are exploded schematic views in accordance with the first embodiment of the present invention when in use seen from two different angles.
Figure 11:
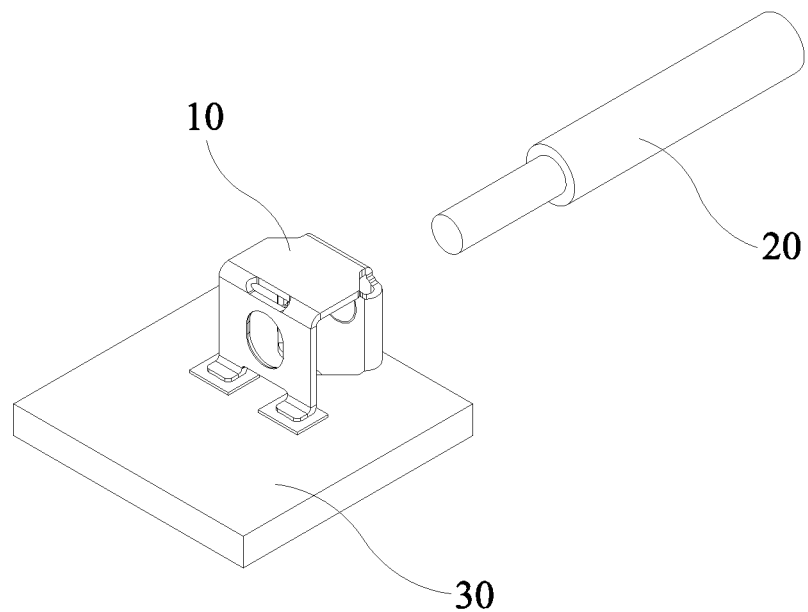
Figure 12:
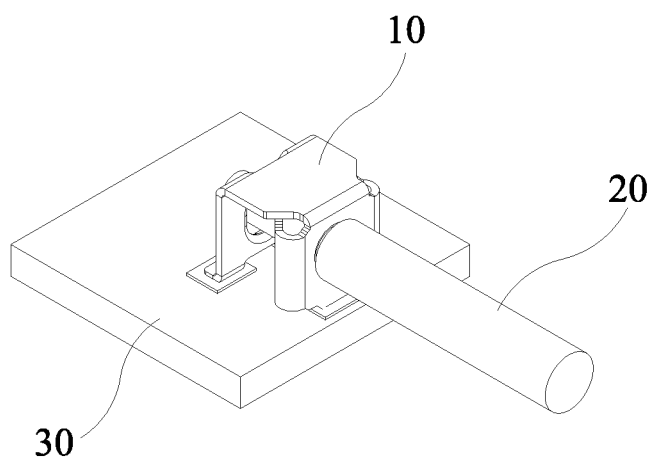
FIGS. 12-13 are assembled schematic views in accordance with the first embodiment of the present invention when in use seen from two different angles.
Figure 13:
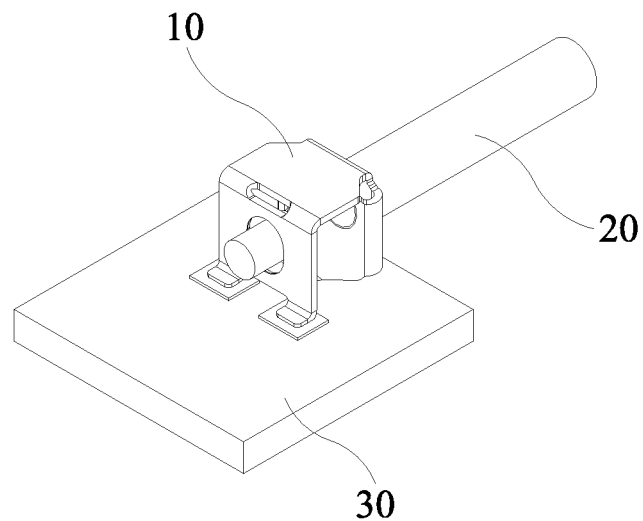
Figure 14:
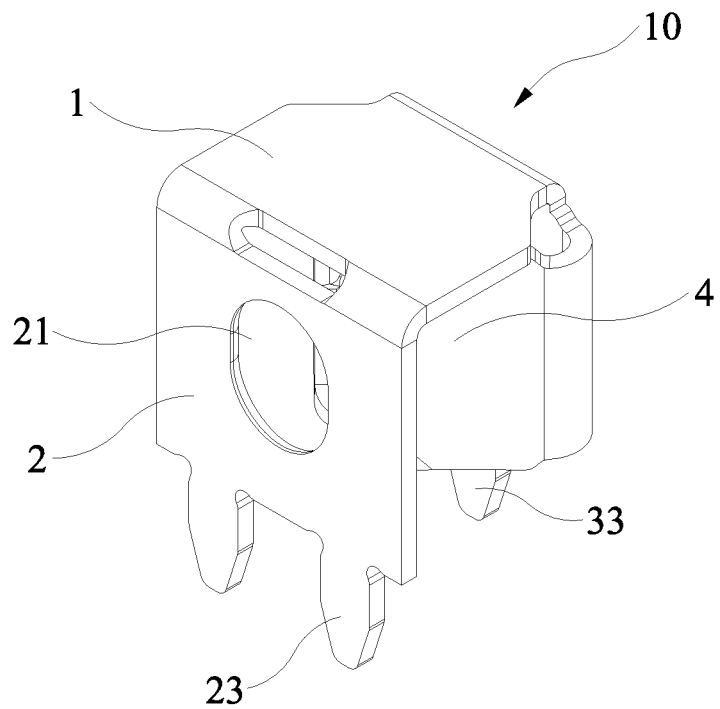
FIGS. 14-16 are perspective views in accordance with a second embodiment of the present invention seen from three different angles.
Figure 15:
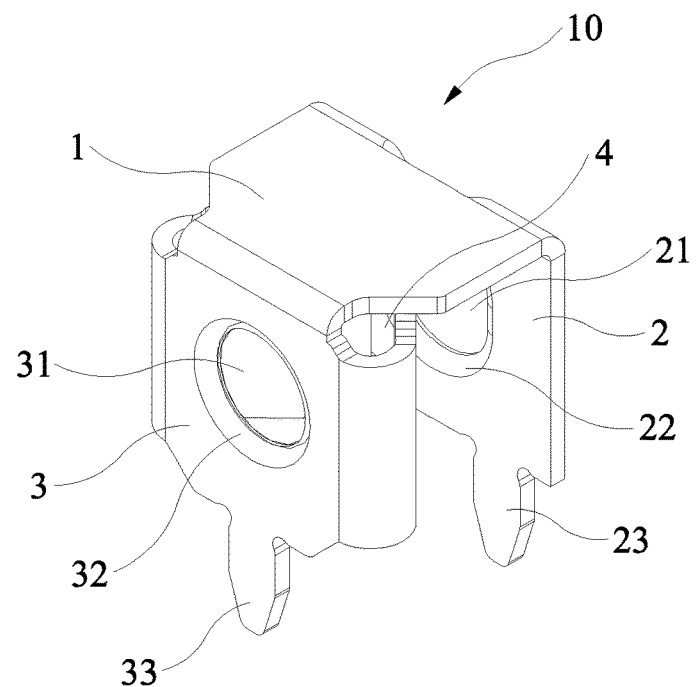
Figure 16:
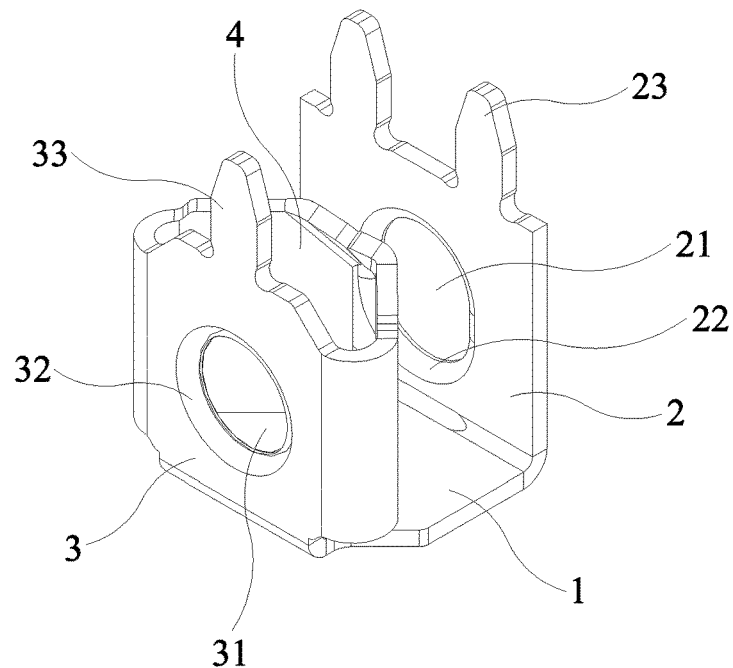
Figure 19:
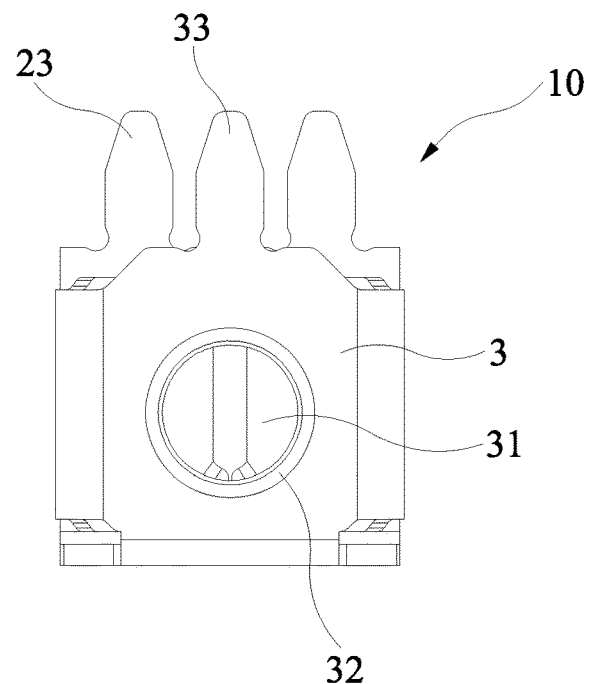
Figure 20:
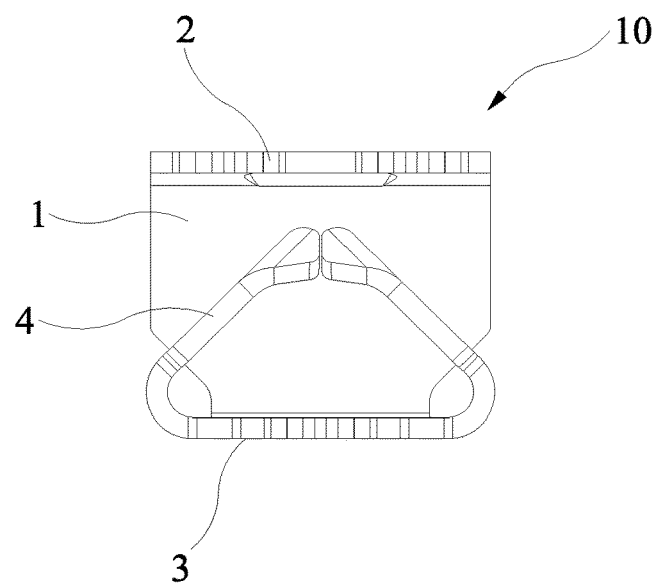
Figure 21:
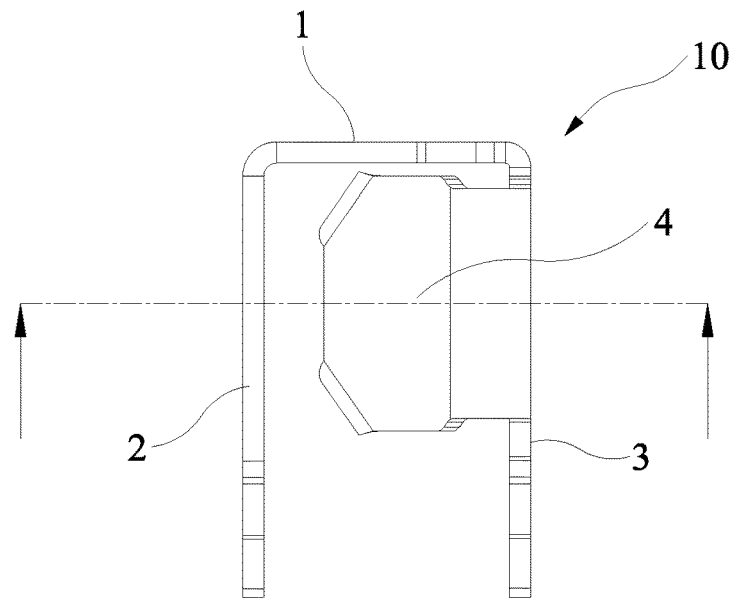
Figure 22:
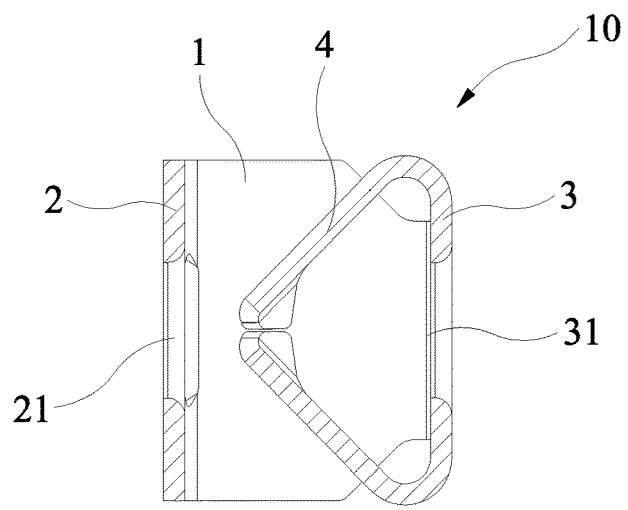
FIG. 22 is a sectional view of FIG. 21.
Figure 23:
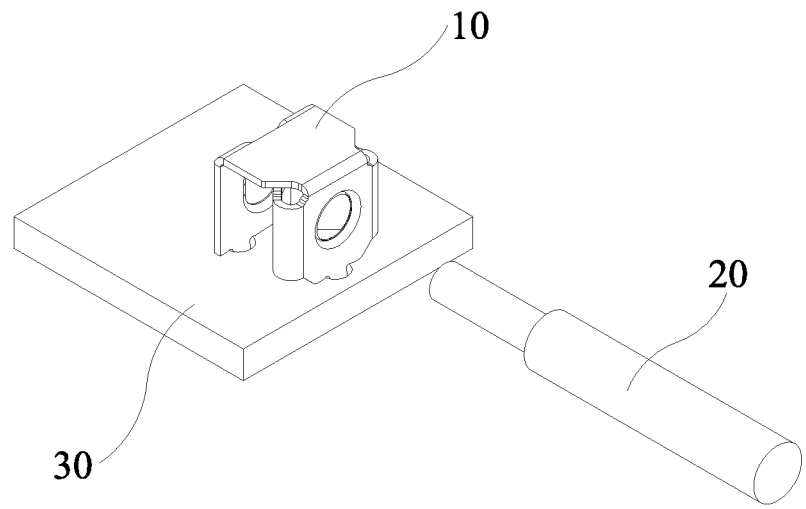
FIGS. 23-24 are exploded schematic views in accordance with the second embodiment of the present invention when in use seen from two different angles.
Figure 24:
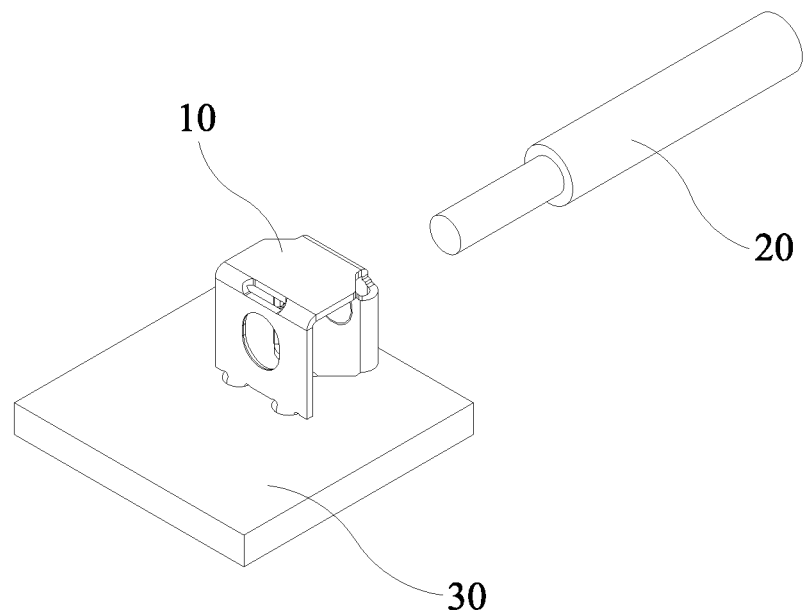
Figure 25:
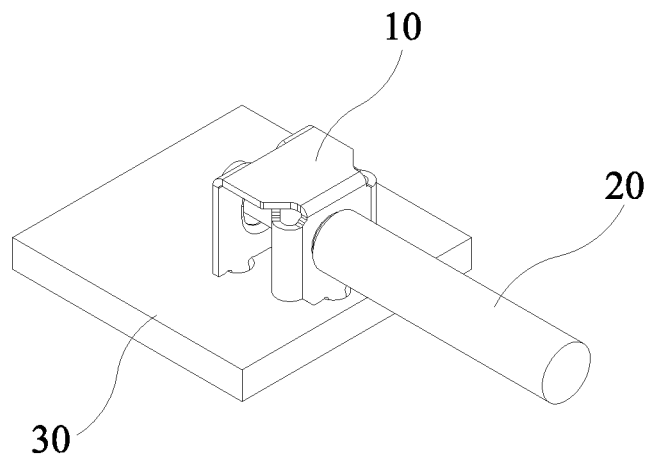
FIGS. 25-26 are assembled schematic views in accordance with the second embodiment of the present invention when in use seen from two different angles.
Figure 26:
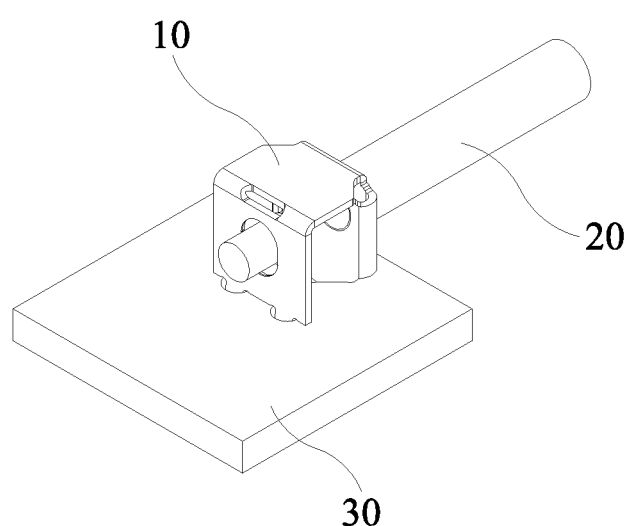

As shown in FIG. 1 to FIG. 26, the present invention discloses an all-metal side-mounted female connector 10. The all-metal side-inserted female connector 10 has a top side 1, a front side 2, and a rear side 3.

The top side 1 is configured for surface mount technology.

The rear side 3 is formed with a guide hole 31. The guide hole 31 is adapted for insertion of a conductive wire 20 (or an insertion pin). In the present invention, the edge of the guide hole 31 is formed with a chamfer 32 for guiding insertion of the conductive wire 20 (or the insertion pin).

A pair of elastic pieces 4 is provided between the front side 2 and the rear side 3, facing the guide hole 31. The elastic pieces 4 are configure to clamp the conductive wire 20 (or the insertion pin). Specifically, the pair of elastic pieces 4 of the present invention is formed by bending left and right ends of the rear side 3 to face each other.

The front side 2 is formed with a limit hole 21 aligned with the guide hole 31. The limit hole 21 is configured to limit the amplitude of the swing the inserted conductive wire 20 (or the insertion pin). In the present invention, the edge of the limit hole 21 is formed with a chamfer 22 for guiding insertion of the conductive wire 20 (or the insertion pin).

The front side 2 and the rear side 3 are formed with a front weld leg 23 and a rear weld leg 32 at respective lower ends thereof. The front weld leg 23 and the rear weld leg 33 are electrically connected to a circuit board 30. In a first embodiment of the present invention shown in FIGS. 1-13, the front weld leg 23 and the rear weld leg 33 are formed by bending the respective lower ends of the front side 2 and the rear side 3 and are fixed to the circuit board 30 by reflow soldering, thereby realizing electrical connection. In a second embodiment of the present invention shown in FIG. 14-26, the front weld leg 23 and the rear weld leg 33 are formed by extending the respective lower ends of the front side 2 and the rear side 3 to be inserted into insertion holes of the circuit board 30 and are fixed by wave soldering, thereby realizing electrical connection and completing dual in-line package (DIP).

The structure of the present invention is simple. In use, after the conductive wire 20 (or the insertion pin) is inserted through the guide hole 31, the elastic pieces 4 clamp the conductive wire 20 (or the insertion pin) to achieve the electrical connection between the conductive wire 20 (or the insertion pin) and the circuit board 30. The operation is convenient. The conductive wire 20 (or the insertion pin) is further inserted to pass through the limit hole 21. The limit hole 21 and the guide hole 31 jointly limit the amplitude of the swing of the inserted conductive wire 20 (or the insertion pin) to protect the elastic pieces 4, thereby preventing the elastic pieces 4 from being crushed and improving the reliability of the product.

The all-metal side-mounted female connector of the present invention may be formed by stamping and bending a metal sheet. The structure is simpler.

Although particular embodiments of the present invention have been described in detail for purposes of illustration, various modifications and enhancements may be made without departing from the spirit and scope of the present invention. Accordingly, the present invention is not to be limited except as by the appended claims.

What is claimed is:

1. An all-metal side-inserted female connector, having a top side, a front side and a rear side, the rear side being formed with a guide hole, a pair of elastic pieces being provided between the front side and the rear side, facing the guide hole, the front side being formed with a limit hole aligned with the guide hole, the front side and the rear side being formed with a front weld leg and a rear leg at respective lower ends thereof, the front weld leg and the rear weld leg being electrically connected to a circuit board.

2. The all-metal side-inserted female connector as claimed in claim 1, wherein the pair of elastic pieces is formed by bending left and right ends of the rear side to face each other.

3. The all-metal side-inserted female connector as claimed in claim 1, wherein the front weld leg and the rear weld leg are formed by bending the respective lower ends of the front side and the rear side and are fixed to the circuit board by reflow soldering.

4. The all-metal side-inserted female connector as claimed in claim 1, wherein the front weld leg and the rear weld leg are formed by extending the respective lower ends of the front side and the rear side to be inserted into insertion holes of the circuit board and are fixed by wave soldering.

5. The all-metal side-inserted female connector as claimed in claim 1, wherein an edge of the guide hole is formed with a chamfer.

6. The all-metal side-inserted female connector as claimed in claim 1, wherein an edge of the limit hole is formed with a chamfer.

7. The all-metal side-inserted female connector as claimed in claim 1, wherein the all-metal side-mounted female connector is formed by stamping and bending a metal sheet.

8. The all-metal side-inserted female connector as claimed in claim 2, wherein the pair of elastic pieces tapers down from the rear side towards the front side.

* * * * *